(12) United States Patent
Yu et al.

(10) Patent No.: US 8,536,635 B1
(45) Date of Patent: Sep. 17, 2013

(54) SEMICONDUCTOR STRUCTURE AND FABRICATION METHOD THEREOF

(75) Inventors: Chien-An Yu, Taipei (TW); Yuan-Sung Chang, New Taipei (TW); Feng-Ling Chen, Taoyuan County (TW); Chun-Hung Chien, Taipei (TW)

(73) Assignee: Nanya Technology Corp., Kueishan, Tao-Yuan Hsien (TW)

( * ) Notice: Subject to any disclaimer, the term of this patent is extended or adjusted under 35 U.S.C. 154(b) by 0 days.

(21) Appl. No.: 13/469,104

(22) Filed: May 11, 2012

(51) Int. Cl.
*H01L 29/94* (2006.01)

(52) U.S. Cl.
USPC ............ 257/301; 257/E21.646; 257/E27.084; 257/E29.346

(58) Field of Classification Search
USPC ........... 257/301, E21.646, E27.084, E21.546, 257/E29.346, E27.112, E29.34, 5, E21.09
See application file for complete search history.

(56) References Cited

U.S. PATENT DOCUMENTS 6,452,224 B1 * 9/2002 Mandelman et al. ......... 257/296
6,653,678 B2 * 11/2003 Chidambarrao et al. ..... 257/301

* cited by examiner

*Primary Examiner* — Zandra Smith
*Assistant Examiner* — Paul Patton
(74) *Attorney, Agent, or Firm* — Winston Hsu; Scott Margo

(57) ABSTRACT

A semiconductor structure includes a semiconductor substrate having thereon a plurality of deep trenches and a plurality of pillar structures between the deep trenches, wherein each of the plurality of pillar structures comprises an upper portion and a lower portion. A doping region is formed in the lower portion. A diffusion barrier layer is disposed on a sidewall of the lower portion.

11 Claims, 5 Drawing Sheets

SEMICONDUCTOR STRUCTURE AND FABRICATION METHOD THEREOF

BACKGROUND OF THE INVENTION

1. Field of the Invention

The present invention relates generally to a semiconductor structure and, more particularly, to an improved memory structure having low-resistance buried digit lines and method of forming the same.

2. Description of the Prior Art

Electronic storage devices such as dynamic random access memory (DRAM) have been an essential resource for the retention of data. Conventional semiconductor DRAM typically incorporate capacitor and transistor structures in which the capacitors temporarily store data based on the charged state of the capacitor structure. In general, this type of semiconductor memory often requires densely packed capacitor structures that are easily accessible for electrical interconnection.

The capacitor and transistor structures are generally known as memory cells. The memory cells are arranged into memory arrays. The memory cells are addressed via a word line and a digit line, one of which addresses a "column" of memory cells while the other addresses a "row" of memory cells. Recently, there has been increasing research on the buried word line/digit line cell array transistor in which a word line or a digit (bit) line is buried in a semiconductor substrate below the top surface of the substrate.

However, as the packing density in integrated circuits increases, it becomes more difficult to reduce the resistance of a buried digit line in the memory array. Therefore, there is a need in this industry to provide an improved memory structure and fabrication method thereof in order to cope with such problems.

SUMMARY OF THE INVENTION

It is one object of the present invention to provide an improved semiconductor structure for memory devices utilizing buried digit line architecture in order to solve the above-described prior art problems or shortcomings.

According to one embodiment of the invention, a semiconductor structure includes a semiconductor substrate having thereon a plurality of deep trenches and a plurality of pillar structures between the deep trenches, wherein each of the plurality of pillar structures comprises an upper portion and a lower portion. A doping region is formed in the lower portion. A diffusion barrier layer is disposed on a sidewall of the lower portion. The diffusion barrier layer is in direct contact with the sidewall of the lower portion.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

Figure 1:
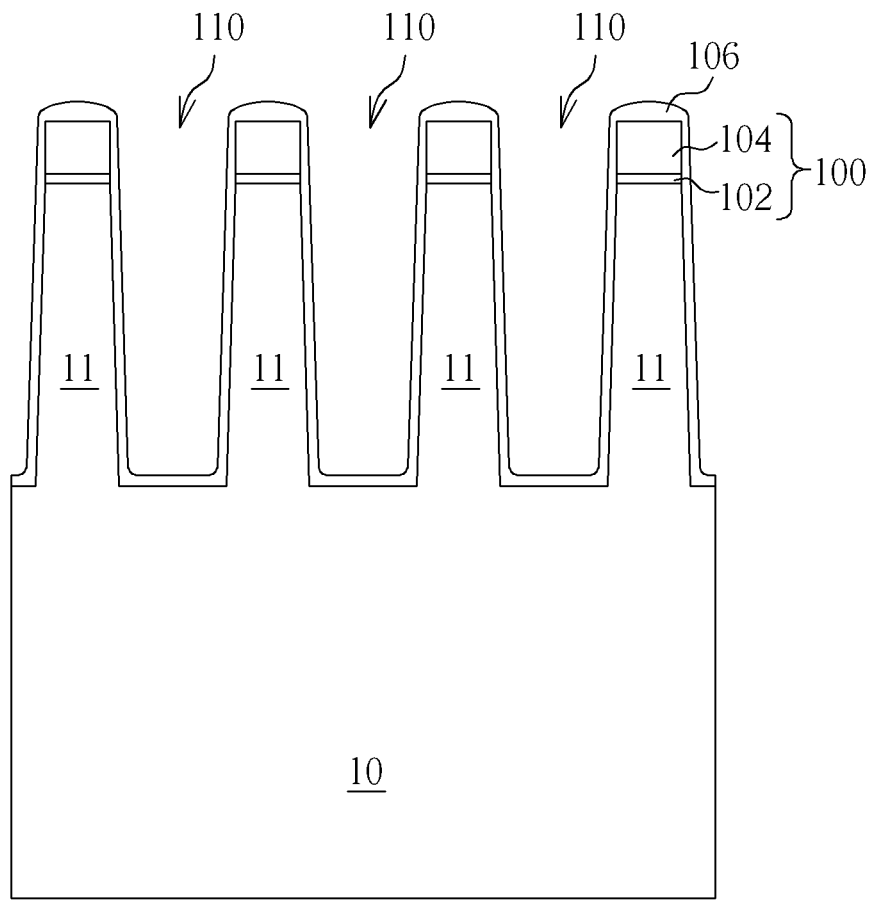
FIG. 1 to FIG. 5 are schematic, cross-sectional diagrams showing a method for fabricating a memory structure having a low-resistance buried digit line in accordance with one embodiment of this invention.

It should be noted that all the figures are diagrammatic. Relative dimensions and proportions of parts of the drawings have been shown exaggerated or reduced in size, for the sake of clarity and convenience in the drawings. The same reference signs are generally used to refer to corresponding or similar features in modified and different embodiments.

DETAILED DESCRIPTION

Reference will now be made in detail to example embodiments, examples of which are illustrated in the accompanying drawings. However, example embodiments are not limited to the embodiments illustrated hereinafter, and the embodiments herein are rather introduced to provide easy and complete understanding of the scope and spirit of the invention. In the drawings, the thicknesses of layers and regions may be exaggerated for clarity.

Referring to FIG. 1 to FIG. 5, a method for fabricating a memory structure having a low-resistance buried digit line is illustrated according to one embodiment of this invention. As shown in FIG. 1, a semiconductor substrate 10 such as a silicon substrate is provided. A patterned hard mask 100 may be provided on a major surface of the semiconductor substrate 10. According to the embodiment, the patterned hard mask 100 may comprise a silicon oxide layer 102 and a silicon nitride layer 104. It is understood that the patterned hard mask 100 may comprise other material layers depending upon the design requirements. Using the patterned hard mask 100 as an etching mask, a first dry etching process is carried out to etch the semiconductor substrate 10 not covered by the patterned hard mask 100 to a first depth, thereby forming a first trench 110 into the semiconductor substrate 10. For example, the first depth may range between 50-250 nm. Concurrently, a plurality of first pillar structures 11 are formed between the first trenches 110. After the first dry etching process is completed, a conformal sidewall protection layer 106 such as SiN is deposited to cover the sidewalls of the first pillar structures 11 as well as the bottom surfaces of the first trenches 110.

Figure 2:
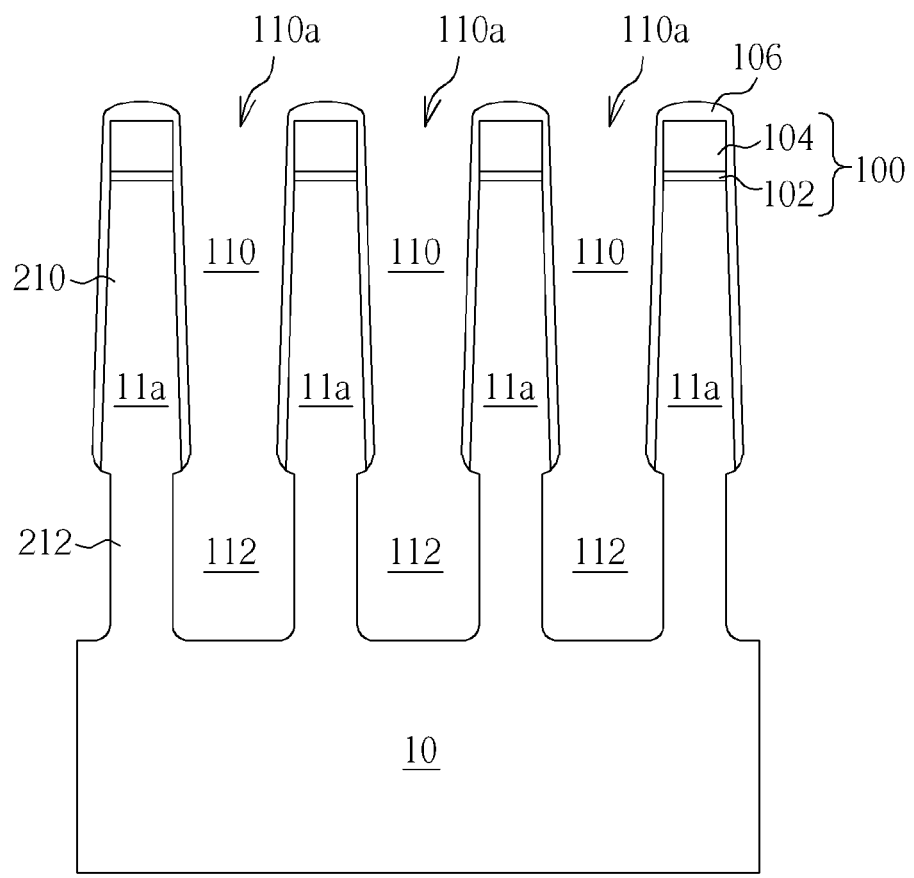

As shown in FIG. 2, after the formation of the sidewall protection layer 106, a second dry etching process is carried out to continue to etch the semiconductor substrate 10 by first etching through the sidewall protection layer 106 at the bottom of each of the first trenches 110. The second dry etching process creates a plurality of second trenches 112 directly under the first trenches 110. The first trench 110 and the second trench 112 constitute a deep trench 110a for the formation of buried digit lines. Optionally, the second trenches 112 may be slightly widened to form a bottle-shaped or flask-shaped deep trench 110a. According to the embodiment, each of the second trenches 112 may be about 60-100 nm deeper than the first trench 110. After the second dry etching process is completed, a plurality of second pillar structures 11a are formed between the first trenches 110 and second trenches 112. At this point, each of the second pillar structure 11a may have an upper portion 210 with its sidewalls covered by the sidewall protection layer 106, and a lower portion 212 having two exposed sidewalls opposite to each other.

According to the embodiment, a vertical-channel transistor of a memory cell (not shown) is to be formed in each of the second pillar structures 11a. The aforesaid memory cell may have a cell size of approximately $4F^2$, where F is the minimum feature dimension or approximately half of the minimum pitch of the memory array. A buried digit line (BDL) for connecting the drain (or source) of the vertical-channel transistor is to be formed in the lower portion 212 of the second pillar structure 11a. The source (or drain) and channel of the vertical-channel transistor are to be formed in the upper portion 210.

Figure 3:
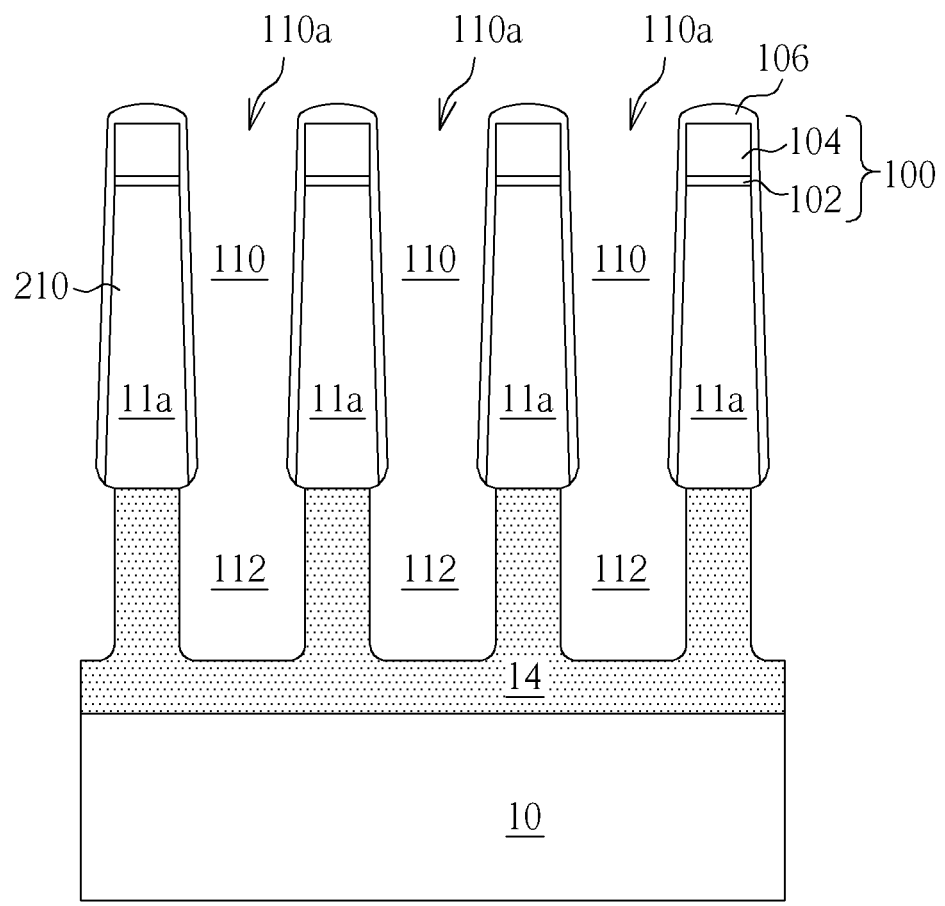

As shown in FIG. 3, through the deep trenches 110a, dopants having, for example, a conductivity type that is opposite to the semiconductor substrate 10, are implanted or diffused into the lower portion 212 of the second pillar structure 11a, thereby forming a doping region 14. According to the embodiment, the doping region 14 may be formed by using gap phase diffusion (GPD) techniques or any other suitable doping methods.

Figure 4:
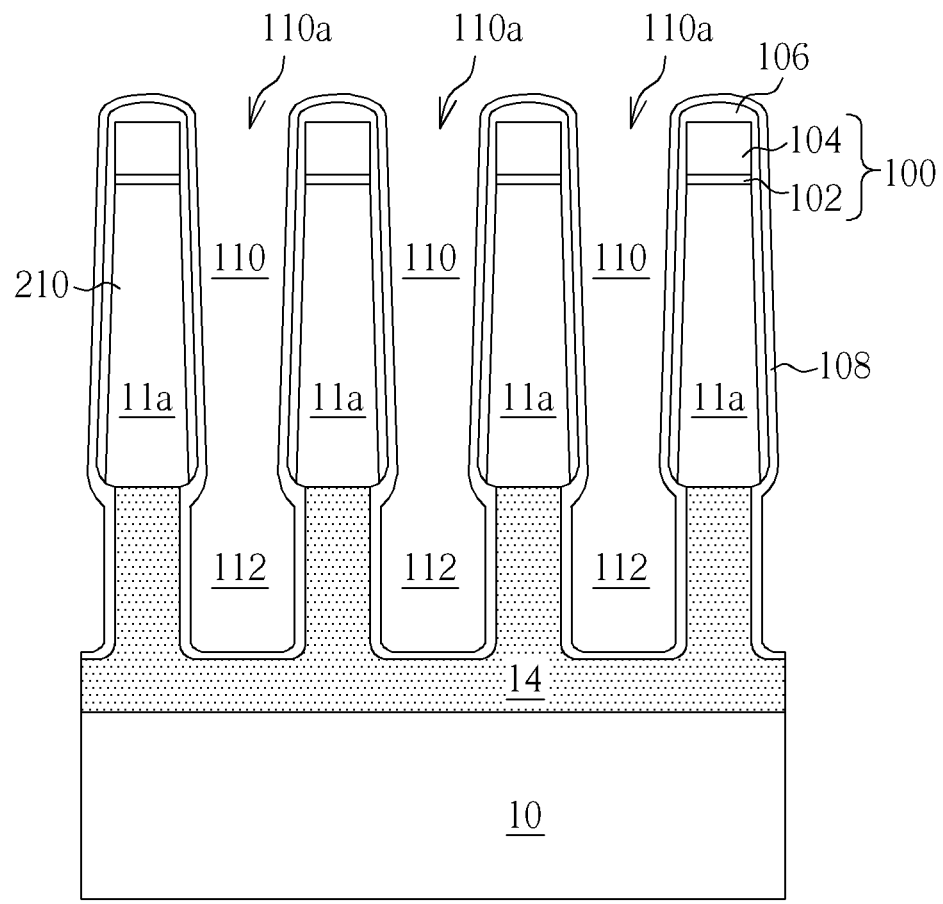

Subsequently, as shown in FIG. 4, a diffusion barrier layer 108 is conformally deposited on the second pillar structure 11a and the bottom of the deep trench 110a. Specifically, the diffusion barrier layer 108 conformally and continuously covers the sidewall protection layer 106 on the upper portion 210, the sidewalls of the lower portion 212 and the bottom of the deep trench 110a. According to the embodiment, the diffusion barrier layer 108 may be formed by using a low-temperature deposition method including, but not limited to, atomic layer deposition (ALD) methods or sub-atmospheric pressure chemical vapor deposition (SACVD) methods.

According to the embodiment, the diffusion barrier layer 108 may have a thickness of about 1-100 angstroms. According to the embodiment, the diffusion barrier layer 108 may comprise dielectric materials such as silicon nitride, silicon oxy-nitride or silicon carbide, and may alternatively comprise conductive materials such as tantalum nitride (TaN) or titanium nitride (TiN). It is one germane feature of this invention that by providing the diffusion barrier layer 108 on the doping region 14, the loss or out-diffusion of the dopants from the doping region 14 can be minimized and a low-resistance buried digit line can be achieved. In other words, the dopants can be effectively kept within the doping region 14 by the diffusion barrier layer 108. The impact of the subsequent treatments such as thermal treatments may be minimized.

Figure 5:
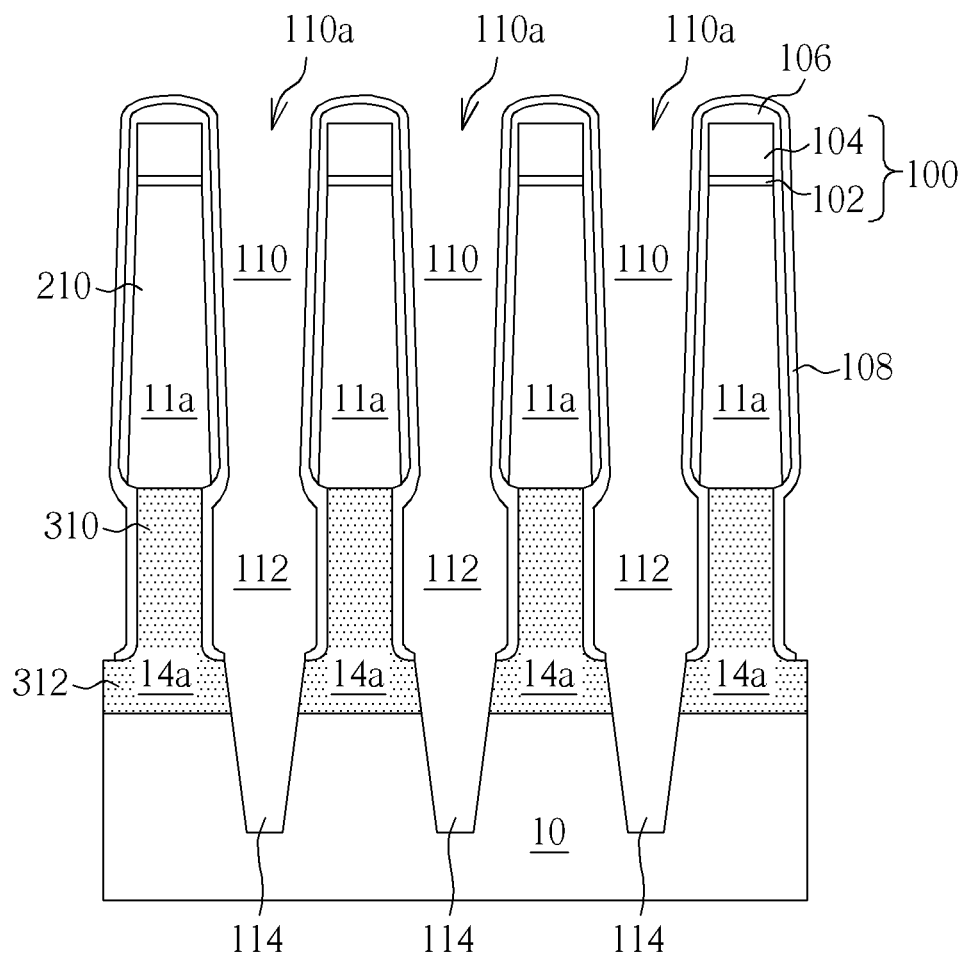

Finally, as shown in FIG. 5, a third dry etching process is carried out to etch through the diffusion barrier layer 108 and the doping region 14 at the bottom of each of the deep trench 110a, thereby forming an isolation trench 114 and individual buried digit line 14a. Other processes, such as gap-filling processes, chemical mechanical polishing (CMP), thermal treatments, word line trench etching, capacitor processes, and so on, may then be performed to form other features of the memory cells.

Structurally, as previously mentioned, the buried digit line 14a is fabricated in a lower portion 212 of each of the second pillar structure 11a with its sidewalls covered by the diffusion barrier layer 108 for restraining the dopants within the doping region 14. As can be seen in FIG. 5, after the formation of the isolation trench 114, each of the buried digit line 14a has an approximately reverse T-shaped cross section comprising a vertical portion 310 and a horizontal portion 312, wherein the sidewalls of the horizontal portion 312 are not covered by the diffusion barrier layer 108.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A semiconductor structure, comprising:
   a semiconductor substrate having thereon a plurality of deep trenches and a plurality of pillar structures between the deep trenches, wherein each of the plurality of pillar structures comprises an upper portion and a lower portion;
   a doping region in the lower portion, wherein the doping region is separated by a plurality of isolation trenches to form individual buried digit line; and
   a diffusion barrier layer disposed on a sidewall of the lower portion.

2. The memory structure according to claim 1 wherein the diffusion barrier layer is in direct contact with the sidewall of the lower portion.

3. The memory structure according to claim 1 wherein the individual buried digit line has an approximately reverse T-shaped cross section.

4. The memory structure according to claim 1 wherein the individual buried digit line has a vertical portion and a horizontal portion, wherein the diffusion barrier layer does not extend to a sidewall of the horizontal portion.

5. The memory structure according to claim 1 wherein the diffusion barrier layer comprises a dielectric material.

6. The memory structure according to claim 5 wherein the dielectric material comprises silicon nitride, silicon oxy-nitride or silicon carbide.

7. The memory structure according to claim 1 wherein the diffusion barrier layer comprises a conductive material.

8. The memory structure according to claim 7 wherein the conductive material comprises TaN or TiN.

9. The memory structure according to claim 1 wherein the diffusion barrier layer has a thickness of about 1-100 angstroms.

10. The memory structure according to claim 1 further comprising a sidewall protection layer covering a sidewall of the upper portion.

11. The memory structure according to claim 10 wherein the diffusion barrier layer covers the sidewall protection layer.

* * * * *